United States Patent
Lo et al.

(10) Patent No.: US 7,341,950 B2
(45) Date of Patent: Mar. 11, 2008

(54) METHOD FOR CONTROLLING A THICKNESS OF A FIRST LAYER AND METHOD FOR ADJUSTING THE THICKNESS OF DIFFERENT FIRST LAYERS

(75) Inventors: Yi-Jen Lo, Dresden (DE); Axel Buerke, Dresden (DE); Sven Schmidbauer, Dresden (DE); Chiang-Hung Lin, Dresden (DE)

(73) Assignees: Infineon Technologies AG, Munich (DE); Nanya Technology Corporation, Kueishan (TW)

( * ) Notice: Subject to any disclaimer, the term of this patent is extended or adjusted under 35 U.S.C. 154(b) by 0 days.

(21) Appl. No.: 11/295,726

(22) Filed: Dec. 7, 2005

(65) Prior Publication Data

US 2007/0125748 A1 Jun. 7, 2007

(51) Int. Cl.
*H01L 21/302* (2006.01)
(52) U.S. Cl. .................. 438/702; 438/703; 438/720; 438/742
(58) Field of Classification Search ............... 438/702, 438/703, 720, 742
See application file for complete search history.

(56) References Cited

U.S. PATENT DOCUMENTS

| | | | |
|---|---|---|---|
| 5,232,872 A | 8/1993 | Ohba | |
| 5,567,483 A | 10/1996 | Foster et al. | |
| 5,858,183 A | 1/1999 | Wolters et al. | |
| 6,207,567 B1* | 3/2001 | Wang et al. | 438/685 |
| 6,455,419 B1* | 9/2002 | Konecni et al. | 438/653 |
| 6,844,591 B1* | 1/2005 | Tran | 257/330 |
| 6,916,729 B2 | 7/2005 | Fang et al. | |
| 2005/0101120 A1 | 5/2005 | Hause et al. | |

FOREIGN PATENT DOCUMENTS

| | | |
|---|---|---|
| DE | 10240116 A1 | 3/2004 |
| EP | 1204140 A2 | 5/2002 |
| WO | WO-99/28955 A2 | 6/1999 |

* cited by examiner

*Primary Examiner*—Binh X. Tran
(74) *Attorney, Agent, or Firm*—Patterson & Sheridan, L.L.P.

(57) ABSTRACT

A method for controlling a thickness of a first layer of an electrical contact of a semiconductor device, whereby the semiconductor device comprises a semiconductor layer, a first layer and a second layer, whereby at least a part of the semi-conductor layer is covered with the first layer, whereby at least a part of the first layer is covered with the second layer, whereby the second layer is exposed to a plasma gas, whereby an upper face of the first layer adjacent to the second layer is treated by the plasma gas and an interlayer is generated between the first and the second layer reducing the thickness of the first layer.

39 Claims, 9 Drawing Sheets

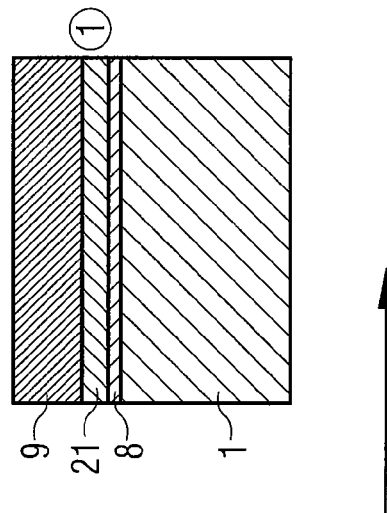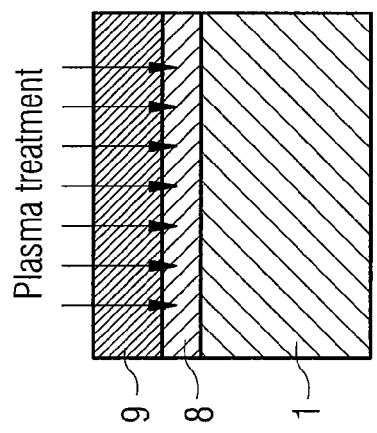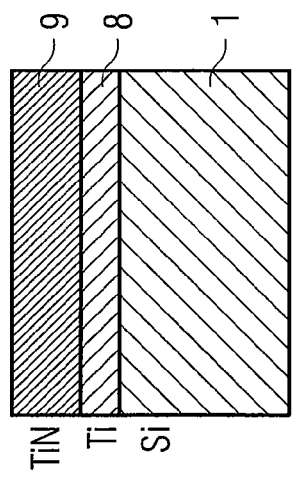

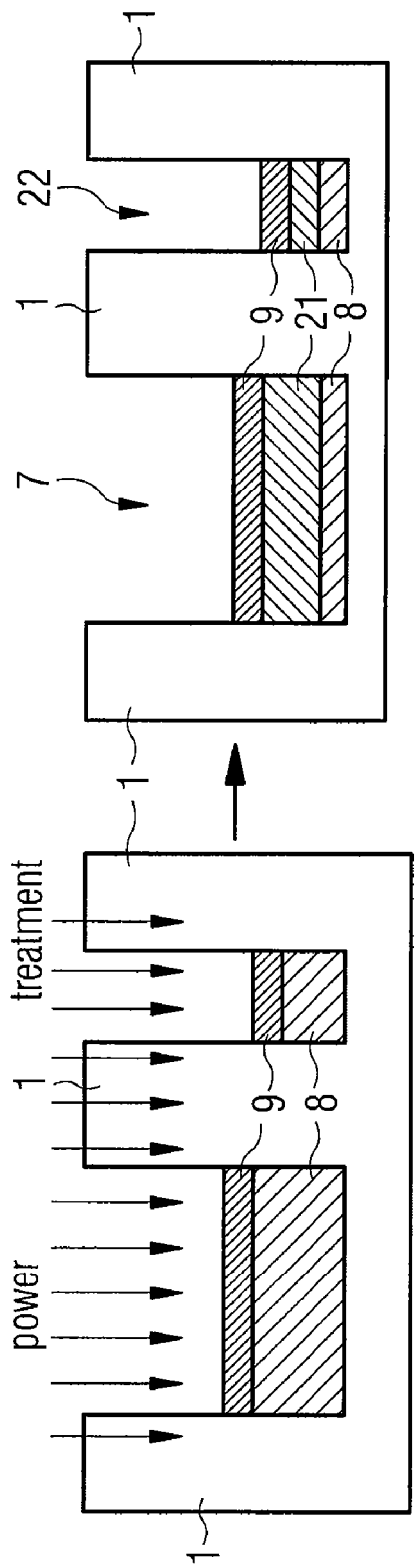

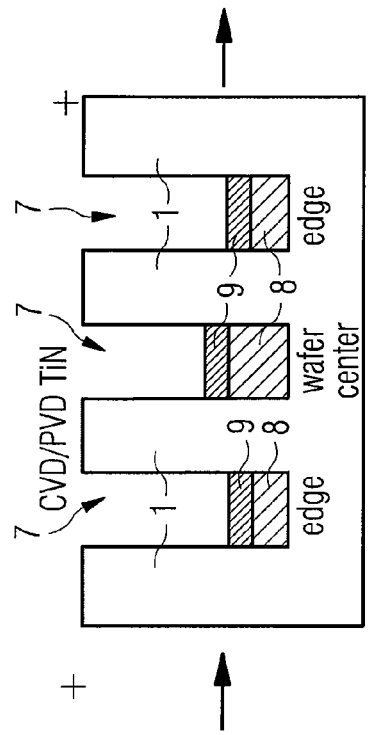
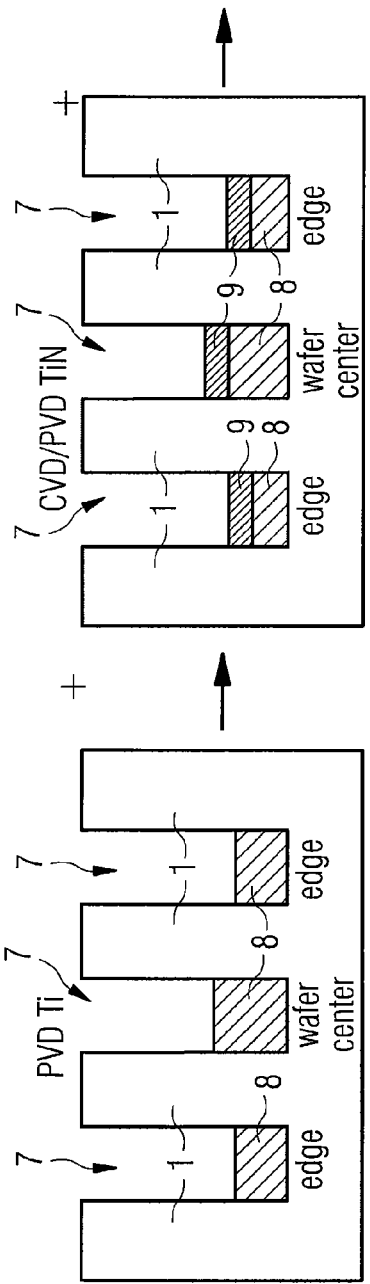
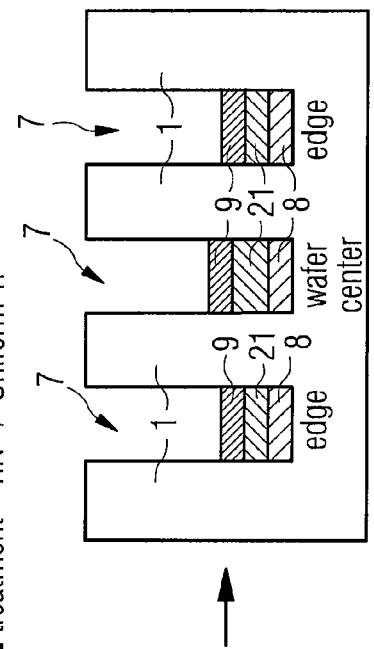
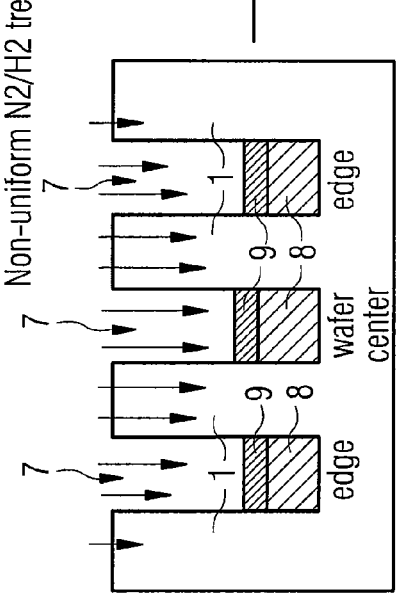

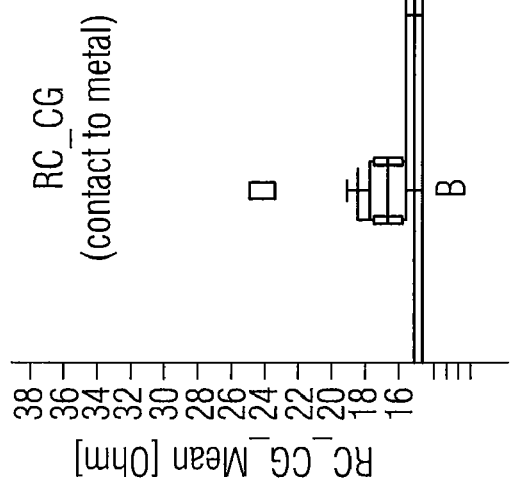
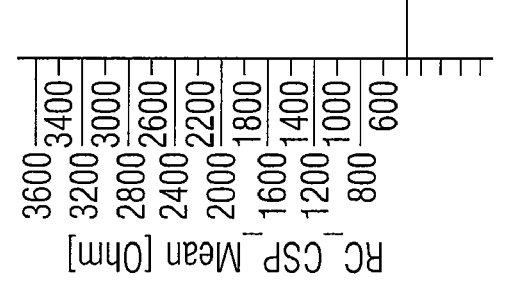

METHOD FOR CONTROLLING A THICKNESS OF A FIRST LAYER AND METHOD FOR ADJUSTING THE THICKNESS OF DIFFERENT FIRST LAYERS

TECHNICAL FIELD OF THE INVENTION

The invention relates to the technical field of electrical contacts on a semiconductor device.

BACKGROUND OF THE INVENTION

Semiconductor devices with electrical contacts are used in different technical areas, for example in memory products. In the field of dynamic random access memories as well as logic an flash chips, the electrical contacts between semiconductor material and conducting metal layers are of interest. However, also in other technical fields, electrical contacts between conducting lines and semiconductor material are of interest and the invention may be applied. By producing the electrical contact between metal and the semiconductor material it is necessary to provide a good electrical contact, i.e. low Ohm resistance between the metal and the semiconductor material. On the other hand, it is necessary to reduce the junction leakage that may be caused by the semiconductor and metallic contact.

It is known in the art to provide a silicon substrate and to produce areas with silicide on the substrate. Silicide is an alloy of silicon and metal and is formed by the reaction of a refractory metal or an almost noble metal with silicon. Silicides are used in a variety of applications. For example, silicide may be used at the source/drain and/or gate area of a transistor, or it may be used to construct a gate or local inter-connecting lines, for example. A silicide is typically formed by depositing a metal layer on a silicon layer, and then annealing the semiconductor/metal structure. When the metal is in contact with the silicon, a silicide is formed. Silicide materials are commonly used in advanced CMOS technology. Silicides reduce sheet resistance and contact resistance, which is particularly advantageous when a silicide is disposed over the source, drain and gate region of a transistor, as an example. Titanium silicide ($TiSi_2$) has been used widely in CMOS technologies in the past, although cobalt silicide ($CoSi_2$) rather than titanium silicide is used as a silicide material, particularly in smaller scale CMOS technologies, such as sub-quarter-micron feature sizes. However, for obtaining a good resistive contact with a minimized leakage current it is necessary to control accurately the annealing temperature and the annealing time.

For high aspect ratios of contact holes, it is known to prefill the contact holes with polysilicon to reduce the high aspect ratio and then to fill up the contact hole with metal, i.e. tungsten (W).

Additionally, U.S. Pat. No. 5,858,183 discloses producing an electrical contact on a semiconductor material by depositing firstly a titanium layer, then by depositing a titanium nitride layer on the titanium layer and additionally by depositing a tungsten layer on the titanium nitride layer. The titanium layer provides a good adhesion and a low contact resistance between the metallization and the semiconductor material. When a tungsten layer is used as a conductive top layer deposited by means of a usual chemical vapour deposition process, the titanium nitride layer serves as a barrier to prevent chemical reactions between the titanium and the fluorine which is formed during such a chemical vapour deposition process. The titanium nitride may be deposited by physical vapour deposition (PVD), chemical vapour deposition (CVD) or metal organic chemical vapour deposition (MOCVD).

SUMMARY OF THE INVENTION

The invention provides a method for controlling a thickness of a first layer of an electrical contact of a device.

According to one embodiment of the invention, the thickness of the first layer can be adjusted after the deposition by using a gas plasma process. With the proposed method a thickness of the first layer can be reduced. Preferably this method is of advantage if contact holes with high aspect ratios have to be filled with an electrical contact. Particularly for contact holes with high aspect ratios it is of advantage to control the thickness of the first layer that is deposited on the layer, as the thickness that is deposited on the bottom of the contact hole may differ from the thickness of the first layer that is deposited on a surface of the device beside the contact hole. Therefore, the proposed method has the advantage that a first layer with a larger thickness can be deposited and after depositing a second layer on the first layer, the thickness of the first layer can be reduced by the gas plasma process whereby a larger thickness of the first layer is advantageous for depositing the second layer.

In another embodiment of the present invention, there is a method for adjusting different thicknesses of first layers of electrical contacts of a device.

In still another embodiment of the present invention, there is a method for producing an electrical contact for a device with a first layer that is deposited on the layer with sufficient thickness that can be controlled by a process step that is used after depositing a second layer on the first layer.

In another embodiment of the present invention, there is a method for controlling a thickness of a first layer of an electrical contact of a device, whereby the device comprises a layer, the first layer and the second layer, whereby at least a part of the layer is covered with the first layer, whereby at least a part of the first layer is covered with the second layer, whereby the second layer is exposed to a gas plasma, whereby an upper face of the first layer adjacent to the second layer is treated by the gas plasma and an interlayer is generated between the first and the second layer reducing the thickness of the first layer.

Additionally, in another embodiment, the present invention is a method for adjusting different thicknesses of first layers of electrical contacts of a device, whereby the device comprises a layer covered with an insulating layer, whereby the insulating layer comprises contact holes to a surface of the layer with different aspect ratios, whereby first layers with different thicknesses are deposited in the contact holes, whereby second layers are deposited on the first layers in the contact holes, whereby the second layers are exposed to a gas plasma, whereby upper faces of the first layers adjacent to the second layers are treated by the gas plasma and interlayers are generated between the first and the second layers reducing the thickness of the first layers, whereby the thicknesses of the interlayers of thicker first layers are thicker than the interlayers of smaller first layers.

The present invention, in still another embodiment, provides a method for producing an electrical contact on a device that is able to reduce the thickness of a first layer that is covered by a second layer by means of a gas plasma treatment that is processed after the deposition of the first and the second layer. This has the advantage that the thickness of the first layer can be adjusted independently from the deposition process. presenting yet another embodiment, the invention refers to a further idea to provide a method for adjusting different thicknesses of first layers of electrical contacts of a device that are produced in contact holes with different aspect ratios. This method has the advantage that, although the aspect ratios of the contact holes are different, first layers with a similar thickness can be produced.

BRIEF DESCRIPTION OF THE DRAWINGS

These and other objects and features of the present invention will become clear from the following description taken in conjunction with the accompanying drawings in which:

FIGS. 4 to 6 show three process steps.

FIGS. 7 to 10 show process steps of a semiconductor device with contact holes of different aspect ratios.

FIGS. 11 to 14 show process steps of another method.

FIG. 19 show a diagram showing a mean ohmic resistance of two samples between the contact and the metal.

FIG. 20 show a diagram showing a mean ohmic resistance between the contact and the semiconductor layer for three samples.

DESCRIPTION OF THE INVENTION

The invention is explained using a semiconductor device with a semiconductor layer as an example. However, the invention can be applied in any device using other materials for the substrate and the layer. Depending on the embodiment, the layer may be made of metal.

Figure 1:
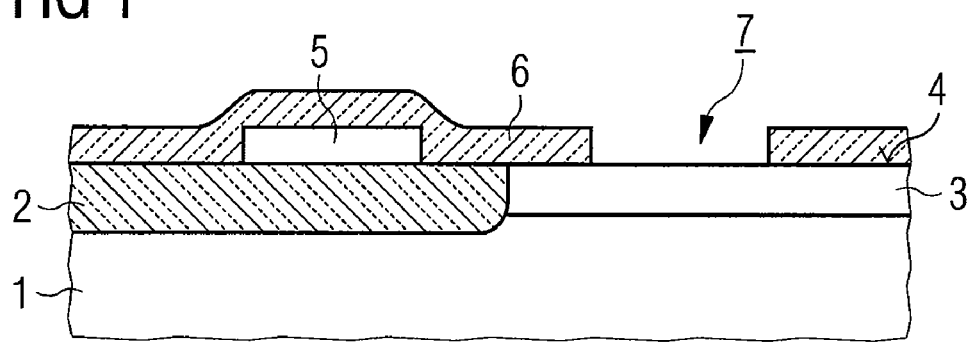
FIG. 1 shows a first process step of a semiconductor device.
Figure 2:
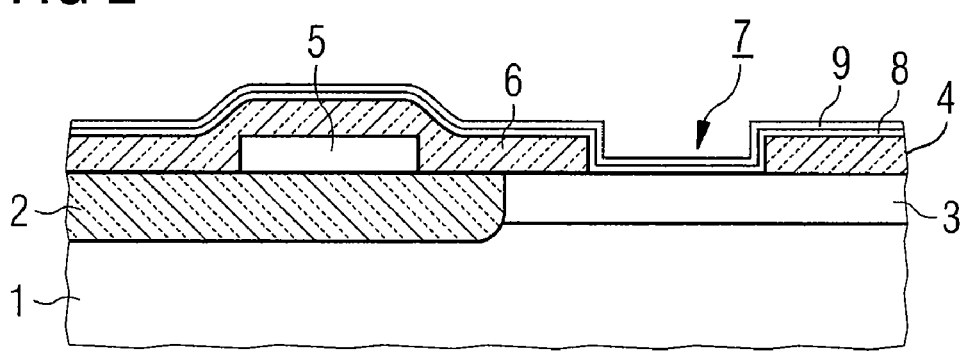
FIG. 2 shows a second process step of the semiconductor device.

FIGS. 1 and 2 show in a diagram and in cross-section two stages of manufacture of a semiconductor device with a semiconductor substrate 1 of, for example an n-type doped monocrystalline silicon in which insulating regions 2 and a semiconductor layer 3 adjoining a surface are provided. The semiconductor layer 3 may be a part of the substrate 1 that is doped in the same or in another type, for example p-type-doped. The insulating region 2 may be a field oxide region. Depending on the embodiment, the layer 3 may comprise metal or it may consist of metal and the substrate may consist of other materials, i.e. metal.

On a surface 4 of the substrate 1, a conductor track 5 is provided. The conductor track 5 is made e.g. of polycrystalline silicon or aluminum. The surface 4 and the conductor track 5 are covered by an insulating layer 6 of, e.g. silicon oxide, silicon nitride, or silicon oxynitride. Contact holes 7 are provided in the insulating layer 6 for contacting surface areas of the semiconductor layer 3.

FIG. 2 depicts a stage of the manufacture process after depositing a first layer 8 in the contact hole 7 and on a surface of the insulating layer 6. The first layer 8 is made for example of titanium, cobalt, nickel, or tungsten. The first layer is deposited for example by a physical vapour deposition process. The thickness of the first layer 8 is in a range smaller than 30 nm, preferably smaller than 15 nm. Depending on the embodiment, the thickness of the first layer 8 on the surface of the semiconductor layer 3 in the contact hole 7 may be in a range between 15 and 5 nm. Due to the aspect ratio of the contact hole 7, the thickness of the first layer 8 in the contact hole 7 depends on the step coverage of the deposition and may be half or less of the thickness of the first layer 8 on the surface of the insulating layer 6. In a physical vapour deposition process, a source material is physically transferred in the vacuum to the substrate without any chemical reaction involved, including evaporation (thermal and e-beam) and sputtering, commonly used for depositing metals.

In a further process step, a second layer 9 is deposited on the first layer 8. A second layer 9 comprising titanium nitride is preferably deposited by a metal organic chemical vapour deposition process. A metal-organic chemical vapour deposition is a CVD process which uses metal-organic compounds as source materials. Metal organics thermally decompose at a lower temperature than other metal compounds. The second layer 9 is deposited with a thickness smaller than the first layer 8 in a range between 20 and 3 nm. In another embodiment of the process the second layer is deposited by a physical vapour deposition.

In a further process step, the first and the second layers 8, 9 are processed by a subsequent plasma treatment, for example a plasma-enhanced chemical vapour deposition process. The plasma may be a direct plasma or a remote plasma. The plasma may comprise any gases, preferably $N_2/H_2$, $NH_3$ or Argon.

In a further process step, a metal layer 10 is deposited on the second layer 9. The metal layer 10 may be connected to a bit line or a word line of a memory device.

Figure 3:
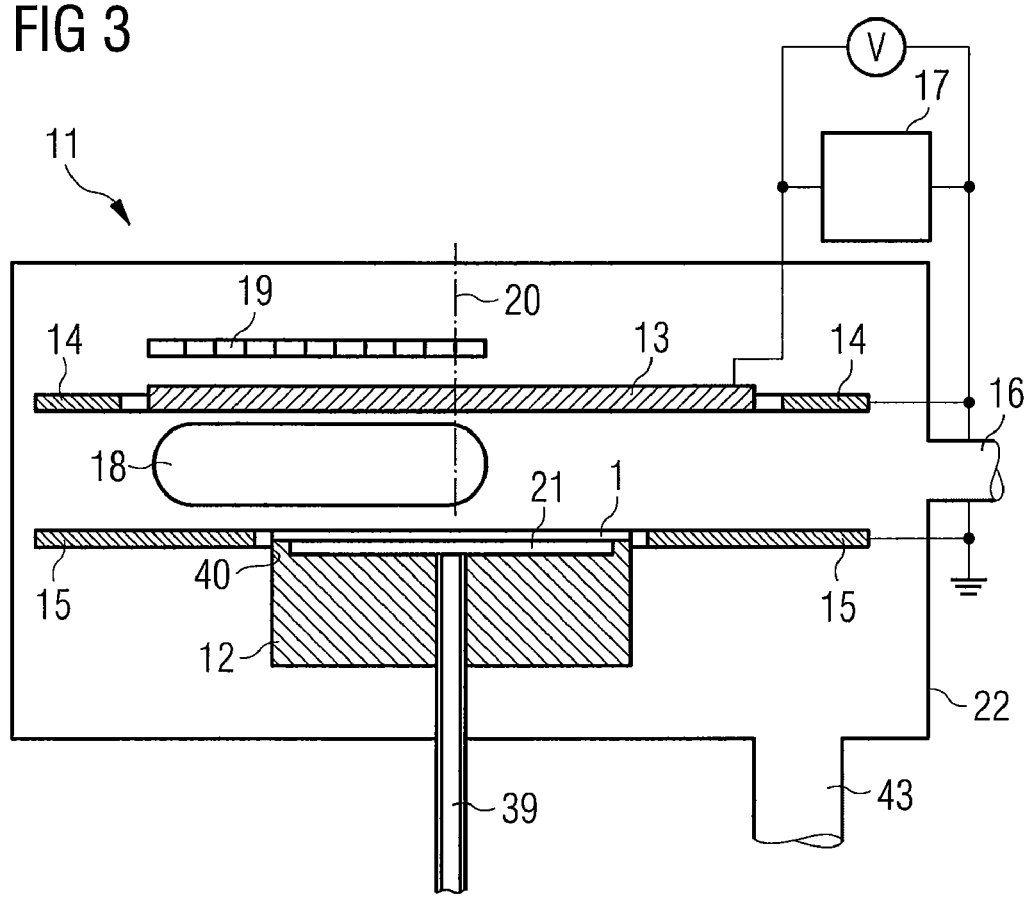
FIG. 3 shows a deposition device.

FIG. 3 depicts a schematic view of a deposition chamber 11 of a deposition device. In the deposition chamber 11, the first and the second layer 8, 9 are deposited on the substrate 1. The substrate 1 is for this purpose deposited in the chamber 11 on a support 12 which is arranged at a distance of approximately 5 cm opposite to a material target 13 i.e. made of titanium. The target 13 is surrounded by an annular anode 14. An earthed screen 15 is provided around the support 12. Then a gas or a gas mixture is lead into the deposition chamber 12 through a feed line 16. An electric supply source 17 is connected between the target 13 and the annular anode 14. A plasma 18 is generated in the gas or gas mixture. The plasma is enclosed between the target 13 and the substrate 1 and in the vicinity of the target 13 by means of magnets 19 arranged behind the target 13.

The magnets 19 may be rotated jointly around an axis 20. In practice, the magnets should rotate around the axis 20 a few times per second during the deposition process, so that the plasma 18 is rotated around the same axis 20. Thereby, it can be achieved that atoms are sputtered homogeneously over the entire surface of the target 13 so that a homogeneous deposition over the substrate 1 is also obtained. The substrate 1 may be a silicon wafer comprising an electrical structure i.e. for manufacturing a semiconductor device, for example a memory device.

The substrate 1 is cooled during deposition by maintaining a gas cushion 23 with a pressure of 100 to 2000 Pascal between the support 12 and the substrate 1.

After the substrate 1 has been placed on the support 12, material is sputtered of the target 13 by the plasma 18 which is generated near the target 13 in argon gas to the deposition of the first layer 8, for example a titanium layer. In a following process step, the second layer is deposited in a gas mixture of argon and nitrogen, for example titanium nitride. The nitrogen gas is fed with the argon gas by the feed line 16.

After the deposition of the second layer 9, the substrate 1 with the first and the second layer is processed by means of a plasma treatment. During the plasma treatment, the pressure in the chamber 11 for a 300 mm diameter wafer is between 0.8 and 2 Torr. The plasma treatment may be processed for the duration of 5 to 30 seconds. Additionally, during the plasma treatment a supply power is used in a range between 1000 and 2000 Watt. Basically, the treatment duration way vary from 3 to 60 seconds.

For other chambers with other sizes for wafers with other diameters, the pressure, the treatment time and the power are different. For example, if a 200 mm diameter wafer is treated by means of the gas plasma process, the range of the power is between 300 and 800 W. Basically the power may vary from 300 to 3000 W.

If titanium nitride is deposited as a second layer by means of an MOCVD process, then TDMAT tetradimethylaminotitanium or TDEAT tetradiethylaminotitanium is used as a precursor for depositing titanium nitride. During the decomposition process, the temperature and the mass flow play a role in film growth rate, step coverage and film property. The temperature of the substrate 1 should be in a region of about 400° C. in case of using a TDMAT process. As deposited titanium nitride film is in an amorphous phase with a high content of carbon and hydrogen, resulting in very high bulk resistivity, it is of advantage to improve the film resistivity by a plasma discharge which is driven by a 350 kHz RF generator at 1750 Watt.

The plasma treatment after the deposition of the first and second layer results in generating an interlayer 21 in an upper layer section of the first layer 8 adjoining the second layer 9.

FIG. 4 depicts a schematic view of a substrate 1 with a first and second layer 8, 9 after the deposition. This structure is treated by a plasma in a way that not only the second layer 9 is treated, but also a partial section of the upper part of the first layer 8 is treated as well, as it is shown in FIG. 5. The plasma treatment is indicated by arrows. By the plasma treatment, an upper section of the first layer 8 is changed to an interlayer 21 as depicted in FIG. 6. This means that in the interlayer 21, the electrical and/or chemical features are changed compared to the first layer 8. Thus, less material of the first layer 8 is available for chemical reactions and electrical behaviour, i.e. less material is available for generating silicide. By means of the plasma treatment, atoms of the gas may be deposited in the interlayer or the structure of the first layer is damaged, which generates imperfections. The interlayer 21 reduces the effective thickness of the first layer 8. Therefore, the plasma treatment has the advantage that the thickness of the first layer 8 can be changed after the deposition of the second layer 9 and basically the thickness of the first layer 8 can be reduced to a predetermined thickness independently of the deposition process. This has the advantage that the thickness of the first layer 8 can be controlled. The thickness of the interlayer 21 depends on process parameters of the plasma treatment and the thickness and the material of the second layer 9. The controlling of the thickness of the first layer 8 is used for achieving a good ohm resistive contact between metal and silicon that requires a sufficient thickness of the first layer 8 and for minimizing a junction leakage caused by formation of huge and uncontrollable silicide grains that requires a limited thickness of the first layer 8. The process window of the thickness of the first layer 8 is reduced for high aspect ratio contact holes and therefore the controlling of the thickness of the first layer is of advantage.

In one example for the use of a first layer 8 deposited by a physical vapour deposition process made of titanium and a second layer 9 deposited with an MOCVD process made of titanium nitride, after the deposition the first layer 8 may have a thickness between 20 and 30 nm beside the contact holes 7 and about 10 to 15 nm at the bottom of the contact holes 7. The second layer 9 may have a thickness between 2 and 6 nm, preferably 3 nm. Depending on the used embodiment, other values for the thicknesses of the first and second layer 8, 9 may be used.

The first and the second layers 8, 9 are treated by the plasma during a time period of between 15 and 30 seconds, preferably during 20 seconds with a plasma power of about 1250 Watt. The plasma treatment reduces the thickness of the first layer 8 to approximately 30% to 50%, resulting in a thickness between 3 and 7 nm after the plasma treatment. The interlayer 21 that is generated by the plasma treatment has a thickness of about 10% to 50% of the thickness of the first layer 8. As plasma gas, a mixture of nitrogen and hydrogen is used. Depending on the embodiment, argon or ammonia gas or a mixture of argon and ammonia is also used. The first layer may be made of titanium, cobalt, nickel, tungsten or a combination thereof. Moreover, if cobalt, nickel or tungsten is used as a first layer, the second layer can be fabricated of TiN. Depending on the embodiment, the plasma treatment can be processed during the deposition of the second layer or after the deposition of the second layer.

The FIGS. 7 to 10 depict different process steps that explain a further method.

Figure 7:
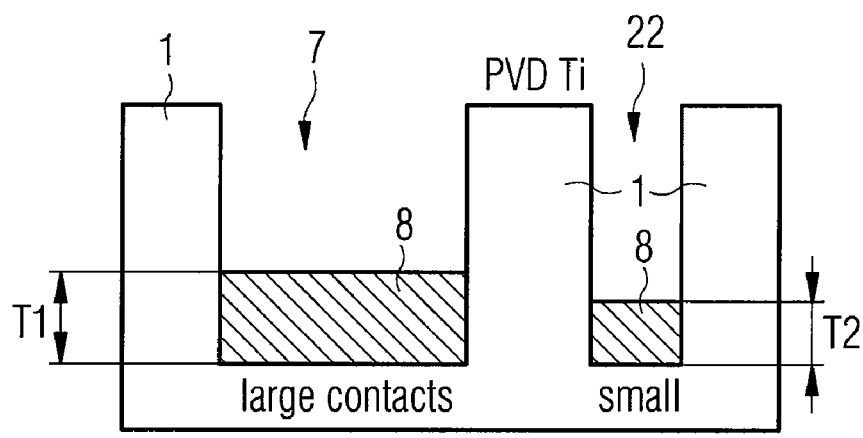

FIG. 7 depicts a substrate 1 with a first and a second contact hole 7, 22 in a schematic view. The first contact hole 7 has a smaller aspect ratio than the second contact hole 21. In this embodiment, the first and the second contact hole 7, 22 have the same depth but the second contact hole 22 has a smaller width. Basically the first and the second contact hole 7, 22 have a circular area cross-section. In the FIGS. 7 to 10 the deposition of the first and the second layer is only depicted in the contact holes 7, 22. The first and the second layers 8, 9 are also deposited on the surface of the substrate 1, however, these deposited layers are not depicted in the Figures for simplifying reasons. In a first process step, the first layer 8 is deposited in the first and the second contact hole 7, 22 as shown in FIG. 7.

In the first contact hole 7, the first layer 8 has a larger first thickness T1 compared to a smaller thickness T2 of the first layer 8 in the second contact hole 22. The difference between the first and the second thickness of the first layer 8 in the first and the second contact hole 7, 22 depends on the difference between the aspect ratios of the first and the second contact holes 7, 22. In the shown example, titanium is deposited as a first layer 8. The higher the aspect ratio of the contact hole 7, 22, the smaller is the thickness of the deposited first layer.

Figure 8:
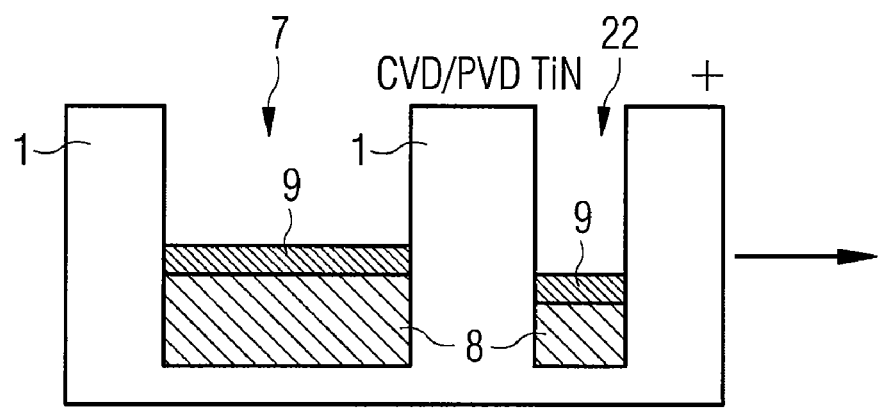

FIG. 8 depicts a second process step after the deposition of the second layer 9 on the first layer 8 of the first and the second contact hole 7, 22. Basically, the thickness of the second layers 9 of the first and the second contact holes 7, 22 also differs. As a second layer 9, for example titanium nitride is deposited. The first and the second layer 8, 9 of the first and the second contact holes 7, 22 are treated with a plasma gas in the chamber 11, as explained above. The gas comprises e.g. nitrogen and hydrogen and treats the first and the second layer 8, 9 as depicted with arrows in FIG. 9.

As explained above, due to the plasma treatment an interlayer 21 is generated starting at an upper face of the first layer 8 adjoining the second layer 9, as depicted in FIG. 10. Due to the high aspect ratio of the second contact hole 22, less depth of the upper face of the first layer 8 is transformed to the interlayer 21 compared to the first layer 8 of the first contact hole 7. Therefore, the interlayer 21 of the second contact hole 22 has a smaller thickness compared to the interlayer 21 of the first contact hole 7 as shown in FIG. 10. This effect results in a thickness of the first layer of the first contact hole 7 and the second contact hole 22 having a similar value. Therefore, with this process a similar thickness and a similar amount of remaining effective material of the first layer at the bottom of the first and the second contact hole 7, 22 are achieved. Therefore, this method allows for depositing a first layer in contact holes with different aspect ratios using a common process and resulting in a similar thickness of the first layer. Preferably, the thickness of the first layer of the first and the second contact hole 7, 22 may be equal, however, at least the differences between the thickness of the first and the second layer after the deposition are reduced by the plasma treatment.

This process also works with other materials for the first layer in example cobalt, nickel or tungsten and also using other plasma gases i.e. argon or ammonia.

The reduction of the thickness of the first layer depends on the power, the time and the pressure during the plasma treatment. The thickness of the first layer is more reduced with more power, longer time and higher pressure during the plasma treatment. The first layer 8 is less reduced during the plasma treatment with a larger thickness of the second layer 9.

FIGS. 11 to 14 depict process steps of another advantageous process. In this example, FIG. 11 depicts a substrate 1 i.e. a silicon wafer comprising several contact holes 7. The contact holes 7 are disposed in different regions of the substrate 1 and because of a non-uniformity of the deposition process, the thickness of the first layers 8 in the contact holes 7 differs. The first layer 8 is deposited by a physical vapour deposition process with a larger deposition rate in the middle of the substrate 1 compared to rim regions of the substrate 1. Therefore the thickness of the first layer 8 in a middle contact hole 7 is larger compared to the thickness of the first layers 8 and the contact holes 7 that are arranged in a rim region of the substrate 1. This process step is shown in FIG. 11. In a following process step, the second layer 9 is deposited in the contact holes 7, as shown in FIG. 12. For simplifying reasons, in the Figures the first and the second layers 8, 9 are only shown in the contact holes 7 and not on the upper face of the substrate 1, where the first and the second layers 8, 9 are also deposited.

This process results in a first and a second layer structure 8, 9 with first layers 8 in the contact holes 7 having different thicknesses. The thicknesses of the first layers 8, however, are a crucial feature for the ohm resistive contact and the leakage current and thus the thickness of the first layers 8 of the different contact holes 7 should not differ too much.

Therefore, in a following process step a non-uniform plasma treatment is used. As depicted in FIG. 13 the plasma treatment is controlled in such a manner that it has a stronger impact on the first layers 8 of the contact holes 7 of a middle area of the wafer and less impact on the first layers 8 of the contact holes 7 that are disposed in rim or edge areas of the substrate 1. Due to the stronger impact on the first layer 8 of the middle contact hole 7, the thickness of the first layer 8 of the middle contact hole 7 is more reduced by the plasma treatment compared to the first layers 8 of the contact holes in the rim or edge areas of the substrate 1. Therefore, in the middle contact hole 7 a thicker interlayer 21 is generated compared to the interlayers 21 of the other contact holes as depicted in FIG. 14. Consequently, the different thicknesses of the first layers 8 of the contact holes 7 are equalized resulting in nearly the same thickness of the first layers 8 of the contact holes in the middle and the rim or edge areas, as shown in FIG. 14. The heights of the fillings in the contact holes 7 still differ. This process also works with other materials as the first layer, e.g. titanium, cobalt, nickel or tungsten.

Figure 15:
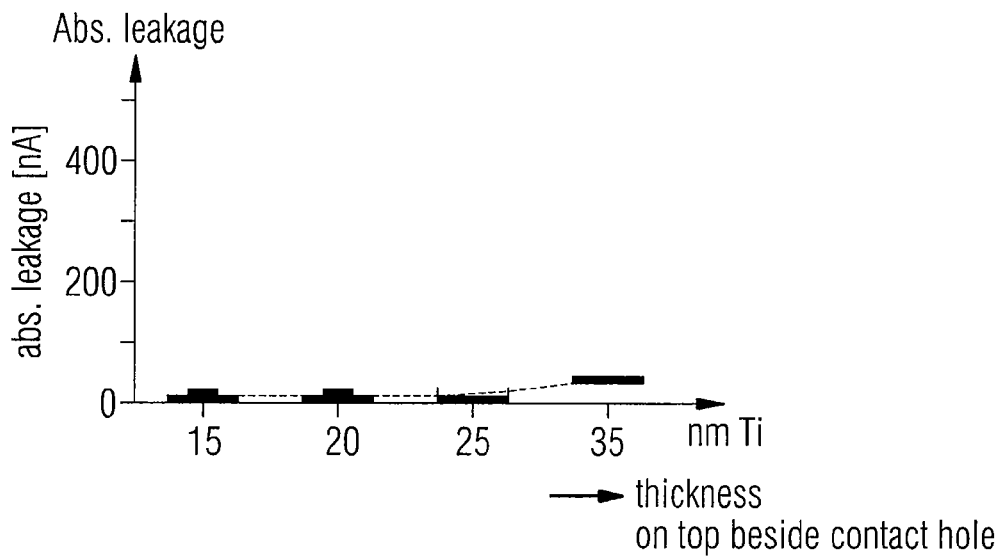
FIG. 15 show a diagram showing the leakage current of the contact depending on the thickness of the first layer.

FIG. 15 depicts a diagram showing the dependency of the leakage current of the electrical contact from the thickness of the first layer made of titanium in this example. As it is shown in the diagram, the leakage increases with a higher thickness of the first layer. The leakage current is measured for a thickness of the first layer 8 of 15 nm, 20, 25 and 35 nm. The given values relate to the top thickness beside the contact hole on the surface of the insulating layer. The relevant thickness of the contact bottom may be less than referred to above. Considering the experimental data, it is clear that the leakage current between a silicon substrate and a titanium first layer depends on the thickness of the first layer.

Figure 16:
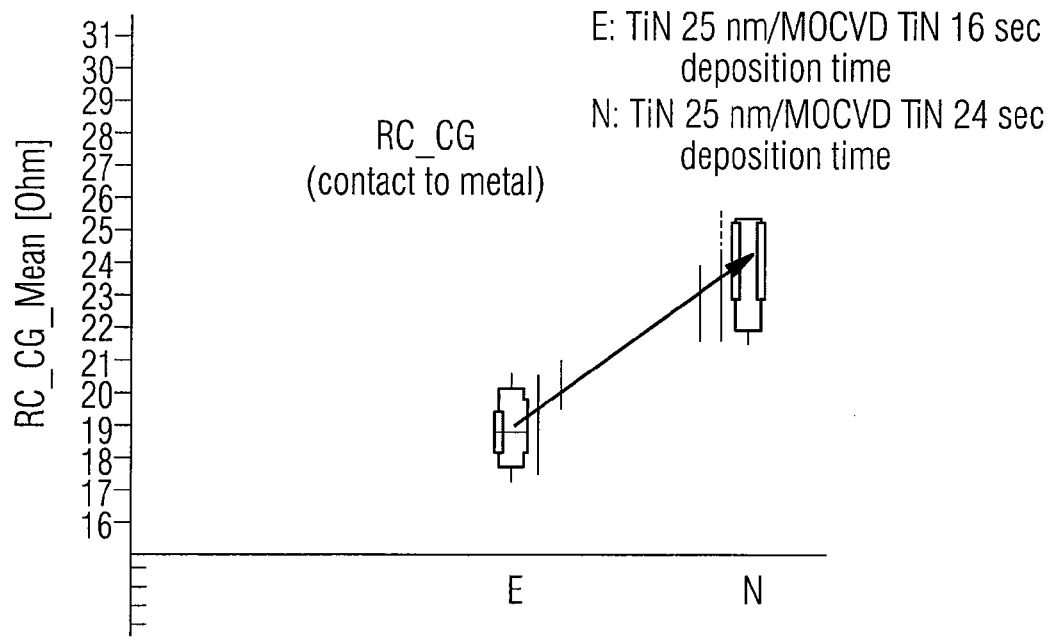
FIG. 16 show a diagram showing the resistance between the contact and the metal.

FIG. 16 depicts the dependency of the ohm resistance of a contact to metal interface of an E-example and an N-example. The E-example and the N-example comprise a substrate of silicon, first layer comprising titanium with a thickness of 25 nm and a titanium nitride layer on the first layer, whereby the second layer was deposited for 16 seconds for the E-example and for 24 seconds for the N-example. This means that the second layer, the titanium nitride layer of the E-example is less thick than the second layer of the N-example. The E- and the N-example were both treated with the same plasma. The N-example shows a higher Ohm resistance between contact and metal showing that the thickness of the second layer influences the reduction of the thickness of the first layer. Due to the larger thickness of the second layer of the N-example, the reduction of the first layer is less for the N-example than for the E-example.

The higher ohm resistive contact between contact layer and metal layer as depicted in FIG. 16 of the N-example compared to the E-example shows that the second layer 9 was not treated by the plasma treatment in the whole thickness, whereby the first layer 8 was not treated at all. This leads to a higher Ohm resistance between the contact and metal interface. Therefore, the n-example has not built up an interlayer 21 reducing the thickness of the first layer 8.

Figure 17:
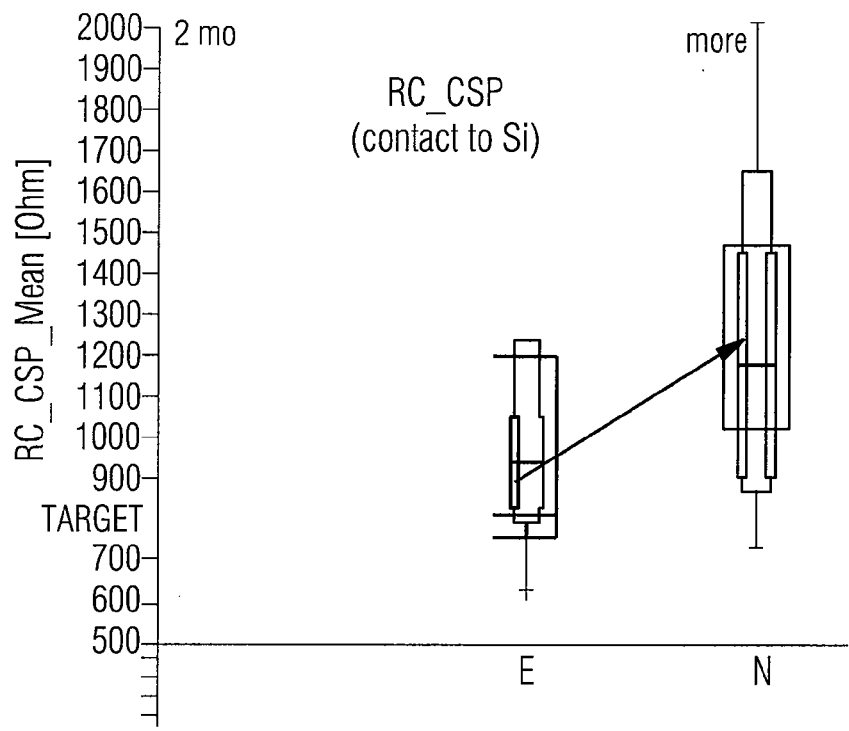
FIG. 17 show a diagram showing the resistance between the contact and the semiconductor layer.

As can be seen by FIG. 17, the Ohm resistance between the contact and the substrate is also higher for the N-example compared to the E-example. This also results from less treatment of the first layer because of the larger thickness of the second layer of the N-example compared to the E-example.

Figure 18:
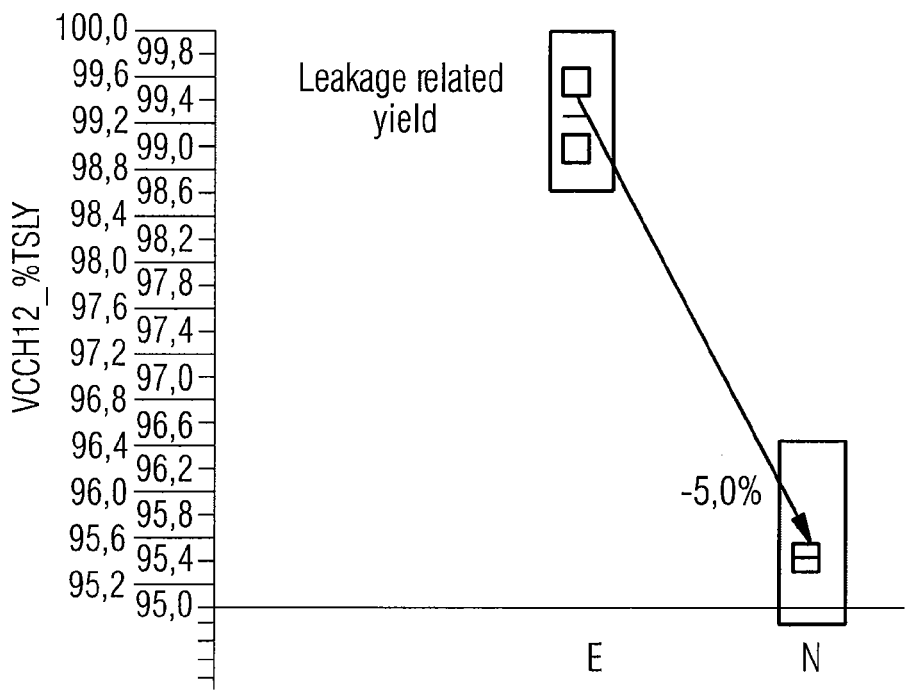
FIG. 18 show a diagram showing a leakage related yield for three different examples.

FIG. 18 depicts a yield for the E-example depending on the leakage compared to the N-example. As it is shown in FIG. 18, the yield of the N-example is reduced for 5% compared to the E-example. This means that the example has a higher yield with a lower leakage because of a reduced effective thickness of the first layer. The N-example has a lower yield and a higher leakage because of a thicker first layer resulting in forming silicide grains, in this example titanium silicon grains.

The FIGS. 17 to 18 show that the thickness of the second layer has an influence on the plasma treatment of the first layer resulting in a lower reduction of the thickness of the first layer in the case of a larger thickness of the second layer.

FIG. 19 depicts a diagram showing the relation between the Ohm resistance of the contact to metal of a B- and an E-example each comprising a substrate 1 with a first layer of titanium. with a thickness of 25 nm. The first layer of the B-example is deposited by a physical vapour deposition process with a second layer of titanium nitride during a deposition time of 16 seconds. Finally, the B-example is treated with plasma using a power of 1250 W during a treatment time of 20 seconds.

The first layer of the E-example is covered with a second layer of titanium nitride using a chemical vapour deposition process during a deposition time of twice 8 seconds. Finally the example is treated with plasma using the same plasma as the B-example, but with more power, i.e. 1750 W during 22 seconds. As it can be seen by FIG. 19, the Ohm resistance between the contact and the metal is nearly the same. This shows that the B- and E-example are both sufficiently treated and the hole thicknesses of the second layers were plasma treated.

FIG. 20 depict the Ohm resistance between the contact and the substrate 1 of the B- and the E-example. As it is shown in FIG. 20, the Ohm resistance between the contact and the substrate 1 is higher for the E-example. It is known that the contacts to silicon react sensitively on the thickness of the first layer. Thinner first layer thickness goes with higher Ohm resistance of the contact to silicon. Therefore the E-example indicates a too high treatment with a too thick inter-facial layer with a too small first layer available for forming a silicide layer, in this example a titanium silicon silicide.

The explained processes may be used by producing dynamic random access memories, flash memories or logic integrated circuit chips. Basically, the explained processes may be used in any technical field where it is of advantage to control and change the thickness of a first layer of an electrical contact that is covered with a second layer after the deposition of the second layer. The explained processes may be advantageous in any method for producing a contact between a semiconductor material, for example silicon, and a metal, for example tungsten or aluminium.

What is claimed is:

1. A method for controlling a thickness of a first layer of an electrical contact of a semiconductor device, comprising:
    forming the first layer on a substrate of the semiconductor device;
    covering at least a part of the first layer with a second layer;
    exposing the second layer to a gas plasma treatment, wherein the gas plasma passes through the second layer and reacts with a surface of the first layer adjacent to the second layer; and
    forming an interlayer between the first layer and the second layer, the interlayer being formed by the reaction between the gas plasma and the surface of the first layer adjacent to the second layer, wherein forming the interlayer reduces the thickness of the first layer.

2. The method according to claim 1, whereby the gas plasma comprises hydrogen and nitrogen.

3. The method according to claim 1, whereby the first layer comprises cobalt.

4. The method according to claim 1, whereby the first layer comprises nickel.

5. The method according to claim 1, whereby the first layer comprises tungsten.

6. The method according to claim 1, whereby the gas plasma comprises ammonia.

7. The method according to claim 1, whereby the gas plasma comprises argon.

8. The method according to claim 1, whereby the gas plasma comprises any combination of hydrogen, nitrogen, ammonia, and argon.

9. The method according to claim 1, whereby the second layer is deposited by a physical vapour deposition process.

10. The method according to claim 1, whereby the second layer is deposited by a metal-organic chemical vapour deposition process.

11. The method according to claim 1, whereby the gas plasma treatment is processed with an electrical power between 300 and 3000 W.

12. The method according to claim 1, whereby the gas plasma treatment is processed with a duration between 5 and 60 seconds.

13. The method according to claim 1, whereby the substrate is a metal layer.

14. The method according to claim 1, whereby the first layer comprises titanium.

15. The method according to claim 14, whereby the titanium is deposited by physical vapour deposition.

16. The method according to claim 14, whereby the second layer comprises titanium nitride.

17. The method according to claim 16, whereby the titanium nitride is deposited by a chemical vapour deposition.

18. The method according to claim 1, whereby the substrate is a semiconductor layer.

19. The method according to claim 18, whereby a memory device is fabricated.

20. The method according to claim 18, whereby a logic device is fabricated.

21. The method according to claim 20, whereby the gas plasma comprises argon.

22. A method for reducing differences in thickness of a first layer of an electrical contact deposited in each of a plurality of contact holes of different aspect ratios of a device, comprising:
    depositing the first layer in each of the plurality of contact holes formed on a substrate, wherein the first layer is formed in each of the plurality of contact holes with varying thicknesses;
    depositing a second layer on the first layer in each of the plurality of contact holes;
    exposing the second layer in each of the plurality of contact holes to a gas plasma treatment, wherein the gas plasma passes through the second layer and reacts with a surface of the first layer adjacent to the second layer; and
    forming an interlayer between the first layer and the second layer in each of the contact holes, the interlayer being formed by the reaction between the gas plasma and the surface of the first layer adjacent to the second layer, wherein forming the interlayer reduces the thickness of the first layer in each of the contact holes and reduces differences in thickness of the first layer in each of the plurality of contact holes by forming a relatively thicker interlayer in contact holes comprising a relatively thicker first layer.

23. The method according to claim 22, whereby the gas plasma comprises hydrogen and nitrogen.

24. The method according to claim 22, whereby the first layer comprises cobalt.

25. The method according to claim 22, whereby the first layer comprises nickel.

26. The method according to claim 22, whereby the first layer comprises tungsten.

27. The method according to claim 22, whereby the gas plasma comprises ammonia.

28. The method according to claim 22, whereby the first layer is deposited by a physical vapour deposition process.

29. The method according to claim 22, whereby the second layer is deposited by a chemical vapour deposition process.

30. The method according to claim 22, whereby the gas plasma treatment is processed with an electrical power between 300 and 3000 W.

31. The method according to claim 22, whereby the gas plasma treatment is processed with a duration between 5 and 60 seconds.

32. The method according to claim 22, whereby the substrate is a semiconductor layer and the device is a semiconductor device.

33. The method according to claim 22, whereby the substrate is a metallic layer.

34. The method according to claim 22, whereby the gas plasma treatment is processed with relatively greater impact on contact holes having a relatively thicker first layer and with a relatively smaller impact on contact holes having a relatively thinner first layer.

35. The method according to claim 22, whereby the first layer comprises titanium.

36. The method according to claim 35, whereby the titanium is deposited by plasma vapour deposition.

37. The method according to claim 35, whereby the second layer comprises titanium nitride.

38. The method according to claim 37, whereby the titanium nitride is deposited by chemical vapour deposition.

39. A method for controlling thickness of a first layer of an electrical contact of a device, comprising:
   forming the first layer on a substrate of the device;
   forming a second layer on at least a portion of the first layer; and
   exposing the second layer to a gas plasma, wherein the gas plasma passes through the second layer and reacts with a surface of the first layer adjacent to the second layer, the reaction between the gas plasma and the surface of the first layer adjacent to the second layer reducing the thickness of the first layer to a predetermined thickness.

* * * * *